(12) United States Patent
Heo

(10) Patent No.: US 7,465,604 B2
(45) Date of Patent: Dec. 16, 2008

(54) METHODS OF FABRICATING ALIGNMENT KEY STRUCTURES IN SEMICONDUCTOR DEVICES INCLUDING PROTECTED ELECTRODE STRUCTURES

(75) Inventor: Jang-Eun Heo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 185 days.

(21) Appl. No.: 11/169,058

(22) Filed: Jun. 28, 2005

(65) Prior Publication Data

US 2006/0001065 A1    Jan. 5, 2006

(30) Foreign Application Priority Data

Jul. 1, 2004    (KR) .................. 10-2004-0051179

(51) Int. Cl.
*H01L 21/00* (2006.01)
(52) U.S. Cl. ..................... 438/95; 438/253; 438/401
(58) Field of Classification Search .............. 438/95, 438/253, 401
See application file for complete search history.

(56) References Cited

U.S. PATENT DOCUMENTS

| | | | |
|---|---|---|---|
| 5,311,061 A | 5/1994 | Sheck | |
| 5,714,768 A | 2/1998 | Ovshinsky et al. | |
| 6,117,720 A | 9/2000 | Harshfield | |
| 6,534,809 B2 * | 3/2003 | Moise et al. | 257/295 |
| 6,774,452 B1 * | 8/2004 | Ramkumar et al. | 257/506 |
| 2003/0127669 A1 | 7/2003 | Doan et al. | |
| 2003/0205723 A1 | 11/2003 | Hawley et al. | |

FOREIGN PATENT DOCUMENTS

| | | |
|---|---|---|
| JP | 06-252024 | 9/1994 |
| JP | 2002-043201 | 2/2002 |
| KR | 1020040008897 | 1/2004 |
| KR | 1020040047272 A | 6/2004 |

OTHER PUBLICATIONS

Notice to File a Response/Amendment to the Examination Report corresponding to Korean Patent Application No. 10-2004-0051179 mailed Jan. 27, 2006.
C. Brubaker et al; *Advances in Processing of Compound Semiconductor Substrates*, no date.

* cited by examiner

*Primary Examiner*—Chandra Chaudhari
(74) *Attorney, Agent, or Firm*—Myers Bigel Sibley & Sajovec, PA

(57) ABSTRACT

An integrated circuit device includes a storage cell including an upper electrode and a lower electrode on a substrate, and a conductive hard mask pattern directly on the upper electrode of the storage cell opposite the lower electrode. The upper electrode is formed of a metal softer than the conductive hard mask pattern. The device further includes an interlayer on the substrate having an alignment key recess therein. The alignment key recess extends towards the substrate beyond a depth of the upper electrode. An alignment key pattern may extend towards the substrate beyond the depth of the upper electrode on opposing sidewalls and on a surface therebetween of the alignment key recess. The alignment key pattern may have a distinct step difference between portions thereof on the opposing sidewalls and portions thereof on the surface therebetween. Related methods are also discussed.

10 Claims, 16 Drawing Sheets

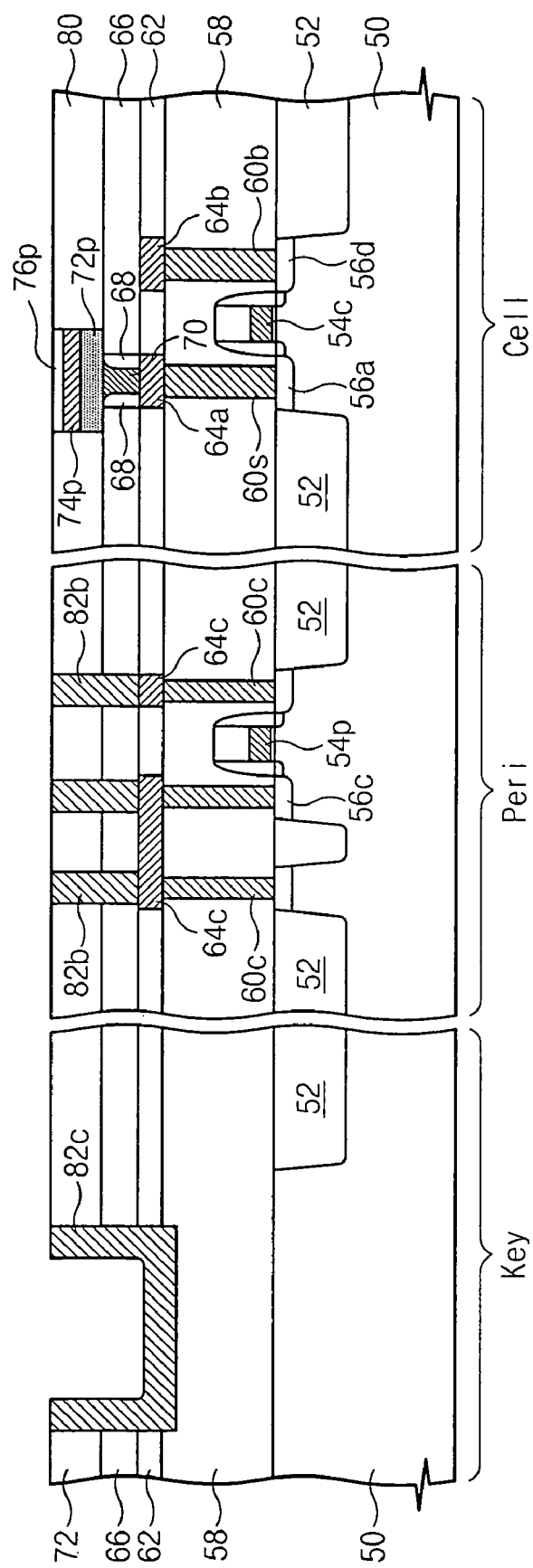

"METHODS OF FABRICATING ALIGNMENT KEY STRUCTURES IN SEMICONDUCTOR DEVICES INCLUDING PROTECTED ELECTRODE STRUCTURES"

CROSS-REFERENCE TO RELATED APPLICATION

This application claims priority from Korean Patent Application No. 10-2004-0051179, filed on Jul. 1, 2004, the contents of which is hereby incorporated by reference herein in its entirety.

FIELD OF THE INVENTION

The present invention relates to semiconductor devices and methods of fabricating the same, and, more specifically, to phase-changeable devices and methods of fabricating the same.

BACKGROUND OF THE INVENTION

Phase-changeable devices typically utilize a phase-changeable material layer that changes crystalline structure based on heat provided thereto in the form of an applied current. More particularly, the phase-changeable material layer may be changed into amorphous state when heated and cooled to a temperature close to the melting point of the material. In contrast, when heated and cooled to a temperature lower than the melting point and higher than a crystallization temperature, the phase-changeable material layer may be changed into crystalline state. Typically, the resistivity of the phase-changeable material layer in the amorphous state is higher than that of phase-changeable material layer in the crystalline state. Accordingly, it may be possible to determine whether information stored at the phase-changeable memory cell is a logical "1" or "0" based on the resistance of the phase-changeable material. Germanium (Ge), tellurium (Te), and a material layer containing stibium (Sb) (hereinafter referred to as a "GST" layer) has been widely used as the phase-changeable material layer.

A method of fabricating a data storage element is disclosed in U.S. Pat. No. 6,117,720 to Harshfield entitled "METHOD OF MAKING AN INTEGRATED CIRCUIT ELECTRODE HAVING A REDUCED CONTACT AREA".

FIG. 1 is a cross-sectional view illustrating a data storage element in a conventional phase-changeable memory device.

The conventional phase-changeable memory device includes an electric conductor 24b, an interlayer insulating layer 32 formed on the electric conductor 24b, and a contact hole formed in the interlayer insulating layer 32. A base layer 40 is formed beneath the contact hole, and a cylindrically shaped spacer 42 is formed on inner sidewalls of the contact hole on the base layer 40. A contact layer 44 connected to the base portion 40 is formed in the cylindrically shaped spacer 42. The contact layer 44 may be a conductive plug. A phase-changeable material layer 46 connected to the conductive plug 44 is formed on the interlayer insulating layer 32.

A memory cell in a phase-changeable memory device may be similar to that of DRAM devices in that the data storage element may be constructed of capacitors. In contrast, however, the data storage element of the phase-changeable memory device may include a phase-changeable material layer. An upper electrode may be formed on the phase-changeable material layer. The upper electrode may be formed of a relatively soft metal such as titanium (Ti) (to promote adhesion) or titanium nitride (TiN) (to suppress heat). Therefore, it may be difficult to prevent etch damage to the upper electrode when a contact pattern is formed to connect the upper electrode and a common electrode.

In addition, a semiconductor device fabrication process may include an alignment step in order to properly align upper and lower patterns. As such, an alignment key may be formed in a scribe line of a wafer. The alignment key may provide alignment between a contact hole (exposing the upper electrode) and the common electrode to be connected to the upper electrode through the contact hole, and may be formed simultaneously when forming the contact pattern.

FIG. 2 illustrates a conventional alignment key which may provide alignment between an upper electrode contact pattern of the phase-changeable memory device and an interconnection layer. FIGS. 3 and 4 are cross-sectional views illustrating conventional methods used to form the alignment key which may provide alignment between the upper electrode contact pattern of the phase-changeable memory device and the interconnection layer.

Referring now to FIG. 2, a memory cell of phase-changeable memory device includes a device isolation layer 12 defining an active region on a substrate 10 and a gate electrode 14 formed on the active region in a cell region B. A first interlayer insulating layer 18 is formed on the surface of the substrate 10 including the gate electrode 14. Conductive plugs 20 are formed on source/drain regions 16. The conductive plugs extend through the first interlayer insulating layer to the source/drain regions 16 at both sides of the gate electrode 14. A second interlayer insulating layer 22 including lower interconnection layers 24a and 24b is formed on the first interlayer insulating layer 18. A data storage element 30 electrically connected to the lower interconnections 24a and 24b is formed on an upper portion of the second interlayer insulating layer 22. The data storage element 30 includes a lower electrode 20, a phase-changeable material pattern 46, and an upper electrode 48. A third interlayer insulating layer 32 is formed on the surface of the substrate including the data storage element 30. In addition, an upper electrode contact pattern 34 is formed extending through the third interlayer insulating layer 32 and connected to the upper electrode 48 of the data storage element 30. An upper interconnection layer 36 is connected to the upper electrode contact pattern 34. In order to align the upper interconnection layer 36 and the upper electrode contact pattern 34, an alignment key pattern 38 is formed in an alignment key region A. The alignment key pattern 38 may be formed in the same step where the upper electrode contact pattern 34 is formed. Accordingly, when a conductive layer is patterned to form the upper interconnection layer 36, the upper electrode contact pattern 34 and the upper interconnection layer 36 may be aligned based on alignment between the alignment pattern and a mask pattern.

Referring now to FIG. 3, a third interlayer insulating layer 32 is formed on the surface of the substrate 10 including the data storage element 30. The third interlayer insulating layer 32 is patterned to form an upper electrode contact hole 34h exposing the upper electrode 48 of the data storage element 30. At this time, the third interlayer insulating layer 32 is also patterned to form an alignment key recess 38k in an alignment key region A. The upper electrode may be formed of a relatively soft metal, such as titanium (Ti) (to promote adhesion) or titanium nitride (TiN) (to suppress heat). Accordingly, the etch rate of the third interlayer insulating layer 32 may be controlled so as not to damage the upper electrode 48 during formation of the upper electrode contact hole 34h and the alignment key recess 38k. As a result, a relatively thin alignment key recess 38k is formed. The depth of the alignment key recess 38k may not be sufficient for use in subsequent processing. In addition, although not shown, a contact pattern may be formed to connect an upper interconnection to a peripheral circuit transistor. However, formation of the upper electrode contact hole 34*h* and a contact hole for the contact pattern may require complex fabrication steps due to different etch thicknesses of the interlayer insulating layer.

Still, referring to FIG. 3, a conductive layer 34*a* is formed on the surface of the substrate including the alignment key recess 38*k* and the upper electrode contact hole 34*h*. As shown in FIG. 3, since the depth of the alignment key recess 38*k* is relatively shallow, the conductive layer 34*a* is formed on an upper portion of the alignment key recess 38*k* with very little step difference relative to portions thereof on the sidewalls of the alignment key recess 38*k*.

Referring now to FIG. 4, the conductive layer 34*a* is etched-back to form an upper electrode contact pattern 34 filling the upper electrode contact hole 34*h*. An alignment key pattern 34*r* having a predetermined step difference is also formed. However, since the depth of the alignment key recess 38*k* is relatively shallow, the step difference of the alignment key pattern 34*r* may not be clearly-defined.

A metal layer 36*a* is formed on the surface of the substrate including the alignment key pattern 34 and the upper electrode contact pattern 34. A photoresist pattern used in forming an upper interconnection layer 36 from the metal layer 36*a* is formed. However, because the step difference of the alignment key pattern 34 may not be sufficiently defined, an optical signal provided by the alignment key may be relatively weak. As a result, misalignment of the upper interconnection layer 36 and the upper electrode contact pattern 34 may occur due to inexact alignment between the photoresist pattern and the substrate. Moreover, when the upper electrode 48 is formed of TiN, the surface of the electrode may be oxidized during a photoresist ashing process after forming an upper electrode contact hole 34*h*, which may reduce electrical contact between the upper electrode contact pattern 34 and the upper electrode 48.

SUMMARY OF THE INVENTION

According to some embodiments of the present invention, an integrated circuit device may include a substrate having an active region therein, a storage cell including an upper electrode and a lower electrode on the substrate, and a conductive hard mask pattern directly on the upper electrode of the storage cell opposite the lower electrode. The upper electrode may be formed of a metal softer than the conductive hard mask pattern. The device may further include an interlayer on the substrate having an alignment key recess therein. The alignment key recess may extend towards the substrate beyond a depth of the upper electrode. The conductive hard mask pattern may be formed of a material having a high etch selectivity relative to the interlayer.

In some embodiments, the device may further include an alignment key pattern extending towards the substrate beyond the depth of the upper electrode on opposing sidewalls and on a surface therebetween of the alignment key recess. The alignment key pattern may have a distinct step difference between portions thereof on the opposing sidewalls and portions thereof on the surface therebetween. An angle between the portions of the alignment key pattern on the opposing sidewalls and the portions on the surface therebetween may be about 90 degrees.

In other embodiments, the interlayer may be on the conductive hard mask pattern and may include a contact hole therein exposing the conductive hard mask pattern. The device may further include an upper electrode contact pattern in the contact hole and electrically connected to the conductive hard mask pattern opposite the upper electrode. The upper electrode contact pattern and the alignment key pattern may be formed of a same material. The device may also include an interconnection layer on the interlayer and electrically connected to the upper electrode contact pattern.

In some embodiments, the device may include an interconnection layer directly on the conductive hard mask pattern opposite the upper electrode.

In other embodiments, the conductive hard mask pattern may be a low-resistance metal layer, and the interlayer may be an insulating layer.

In some embodiments, the upper electrode may be formed of titanium (Ti) and/or titanium nitride (TiN), and the conductive hard mask pattern may be formed of iridium (Ir) and/or iridium oxide (IrO).

In other embodiments, the storage cell may be a phase-changeable memory cell including the upper and lower electrodes and a phase-changeable material layer therebetween.

According to further embodiments of the present invention, a phase-changeable memory device may include a substrate including an alignment key region, a peripheral region, and a cell region therein, a peripheral circuit transistor in the peripheral region of the substrate, and a cell transistor in the cell region of the substrate. A first interlayer insulating layer may be formed on a surface of the substrate between the peripheral circuit transistor and the cell transistor, and a bit line may be formed on the first interlayer insulating layer and electrically connected to a drain region of the cell transistor. A storage plug may be connected to a source region of the cell transistor, and a metal plug may be connected to a source/drain region of the peripheral transistor. A second interlayer insulating layer may be formed on the surface of the substrate between the metal plug, the storage plug, and the bit line. A phase-changeable storage cell may be formed on the second interlayer insulating layer. The phase-changeable storage cell may include a lower electrode extending through the second interlayer insulating layer and electrically connected to the storage plug, a phase-changeable material pattern on the lower electrode, and an upper electrode pattern on the phase-changeable material pattern. A conductive hard mask pattern may be formed directly on the upper electrode opposite the phase-changeable material pattern. A third interlayer insulating layer may be formed on the surface of the substrate and on portions of the storage cell. The third interlayer insulating layer may include an alignment key recess therein extending towards the substrate beyond a depth of the upper electrode in the alignment key region. A metal interconnection layer may be formed on the third interlayer insulating layer and electrically connected to the conductive hard mask pattern, and a metal contact pattern may be formed extending through the second and third interlayer insulating layers and connected to the metal plug. An alignment key pattern may be formed in the alignment key recess. The alignment key pattern may have a distinct step difference between portions thereof on sidewalls of the alignment key recess and portions thereof on a surface therebetween.

According to still further embodiments of the present invention, a method of forming an integrated circuit device may include forming a conductive hard mask pattern directly on an upper electrode of a storage cell on a substrate. The upper electrode may be formed of a metal that is softer than the conductive hard mask pattern. An interlayer may be formed on the substrate having an alignment key recess therein extending towards the substrate beyond a depth of the upper electrode.

In some embodiments, a portion of the interlayer may be recessed beyond the depth of the upper electrode to form the alignment key recess therein. A conductive layer may be formed on opposing sidewalls and a surface therebetween of the alignment key recess to define an alignment key pattern extending towards the substrate beyond the depth of the upper electrode. The alignment key pattern may have a distinct step difference between portions thereof on the opposing sidewalls and portions thereof on the surface therebetween. An angle between the portions of the alignment key pattern on the opposing sidewalls and the portions on the surface therebetween may be about 90 degrees.

In other embodiments, the interlayer may be recessed in a peripheral region of the substrate to define a peripheral contact hole therein. The conductive layer may be formed in the contact hole to form a contact pattern in the peripheral region.

In some embodiments, the conductive hard mask pattern may be formed of a material having a high etch selectivity relative to the interlayer. As such, a portion of the interlayer may be recessed by selectively etching the portion of the interlayer using the conductive hard mask pattern as an etch stop layer.

In other embodiments, the interlayer on the conductive hard mask pattern, and a cell contact hole may be formed in the interlayer exposing at least a portion of the conductive hard mask pattern. An upper electrode contact pattern may be formed in the cell contact hole and electrically connected to the conductive hard mask pattern opposite the upper electrode, and an interconnection layer may be formed on the interlayer and electrically connected to the upper electrode contact pattern.

In some embodiments, the cell contact hole may be formed in a same step as recessing the interlayer to form the alignment key recess. In addition, the conductive layer may be formed in the alignment key recess and in the cell contact hole to define the alignment key pattern and the upper electrode contact pattern in a same step.

In other embodiments, an interconnection layer may be formed directly on the conductive hard mask pattern opposite the upper electrode.

BRIEF DESCRIPTION OF THE DRAWINGS

FIGS. 7A to 7D are cross-sectional views illustrating exemplary intermediate fabrication steps in methods of fabricating phase-changeable memory devices according to further embodiments of the present invention.

DETAILED DESCRIPTION OF EMBODIMENTS OF THE INVENTION

Figure 1:
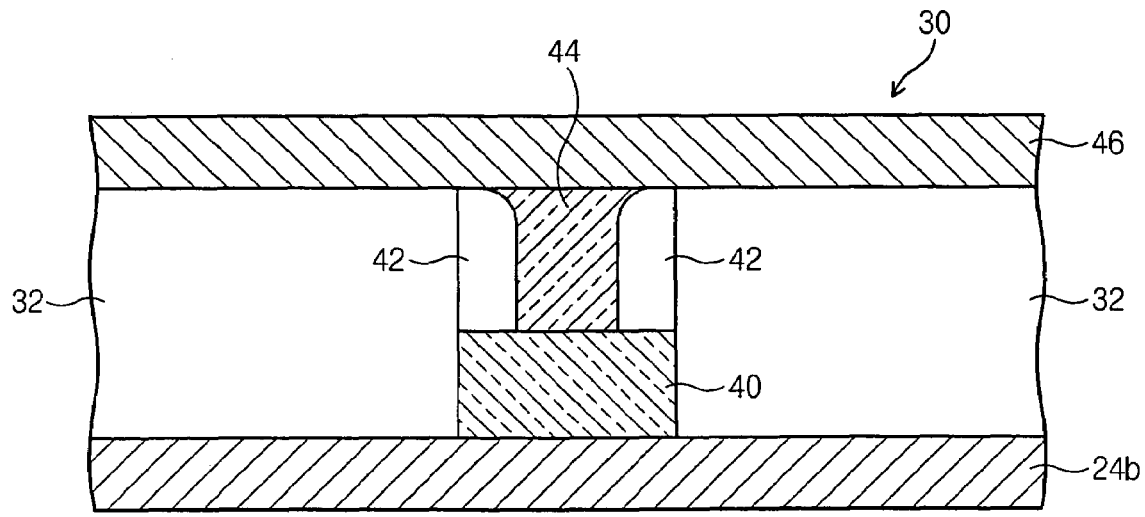
FIG. 1 is a cross-sectional view illustrating a conventional data storage element in a phase-changeable memory device.
Figure 2:
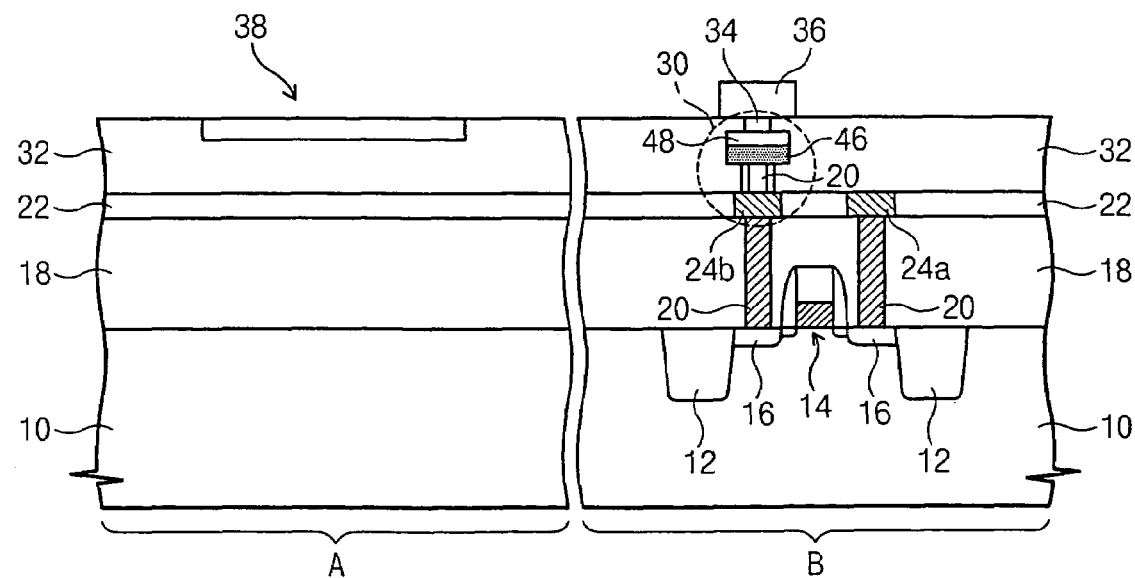
FIG. 2 illustrates a conventional alignment key used to provide alignment between an upper electrode contact pattern of a phase-changeable memory device and an interconnection layer of the phase-changeable memory device.
Figure 3:
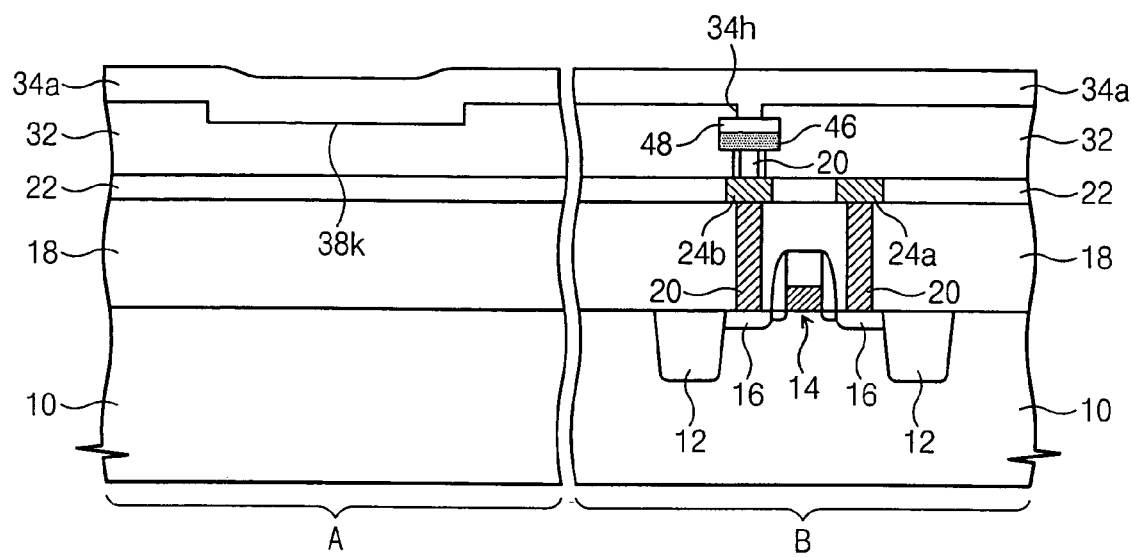
FIGS. 3 and 4 are cross-sectional views illustrating a conventional fabrication process for an alignment key used to provide alignment between the upper electrode contact pattern of a phase-changeable memory device and the interconnection layer of the phase-changeable memory device.
Figure 4:
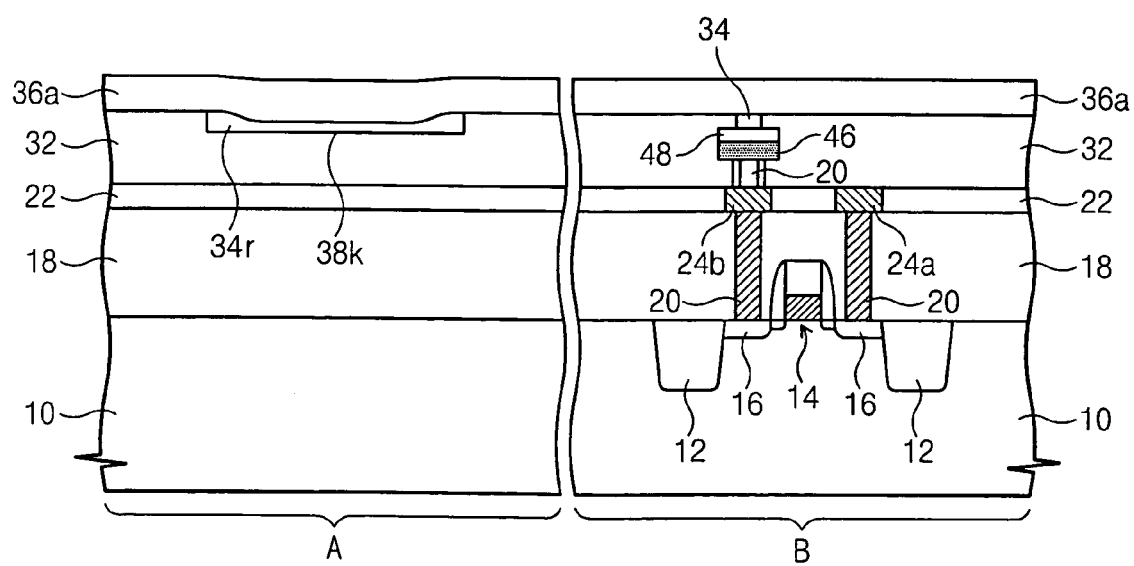

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 5A:
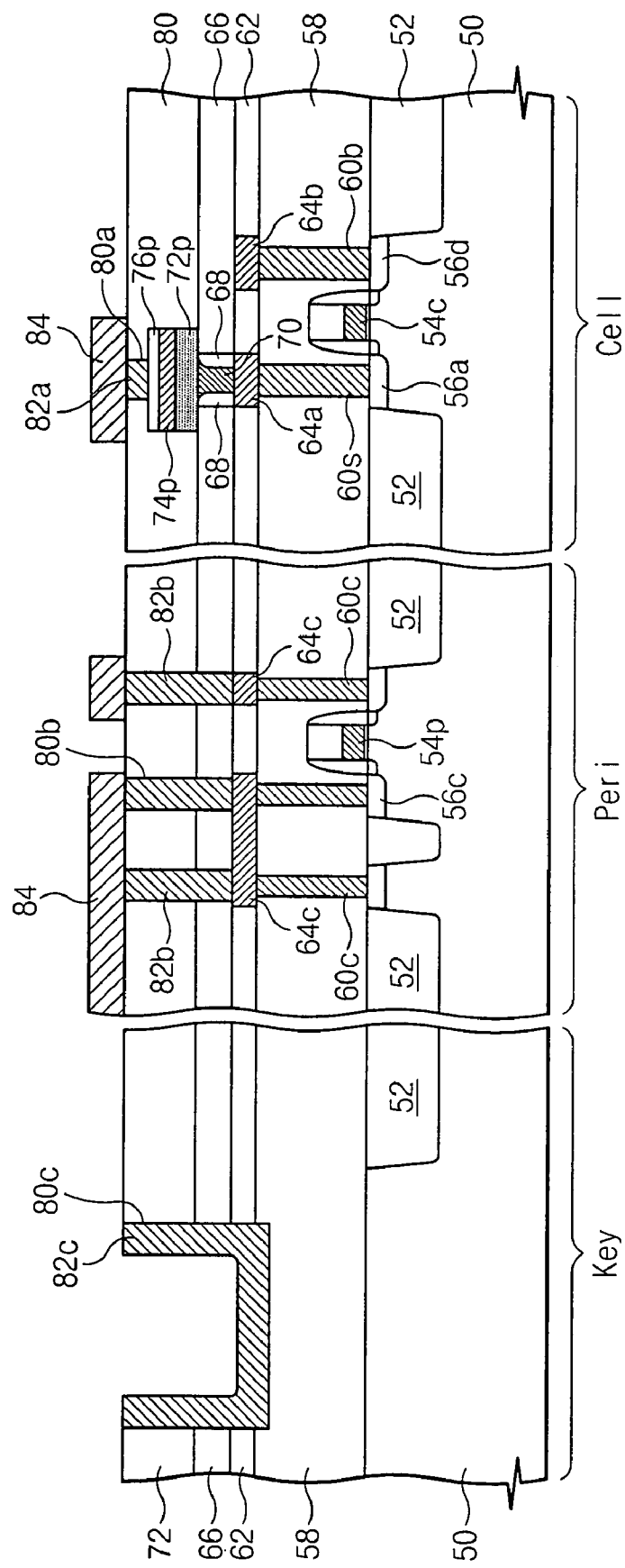
FIGS. 5A to 5B are cross-sectional views illustrating phase-changeable memory devices according to some embodiments of the present invention.

FIG. 5A is a cross-sectional view illustrating phase-changeable memory devices according to some embodiments of the present invention.

Referring now to FIG. 5A, a substrate 50 includes an alignment key region Key, a peripheral region Peri, and a cell region Cell. A device isolation layer 52 is formed on the substrate 50 to define an active region. A peripheral circuit transistor is formed in the peripheral circuit region Peri. A cell transistor Cell is formed in the cell region Cell. The peripheral circuit transistor includes a gate electrode 54p and source/drain regions 56c. The cell transistor includes a gate electrode 54c, a source region 56a, and a drain region 56d.

A first interlayer insulating layer 58 is formed on the surface of the substrate. Contact plugs 60c extend through the first interlayer insulating layer 58 to electrically connect to the source/drain regions 56c of the peripheral circuit transistor. A storage plug 60s is connected to the source region 56a of the cell transistor. A bit line plug 60b is connected to a drain region 56d of the cell transistor. An insulating layer 62 is formed on the first interlayer insulating layer 58. A bit line 64b, a conductive supporting unit 64a, and a lower interconnection layer are formed in this insulating layer 62. The bit line 64b is connected to the bit line plug 60b. The conductive supporting unit 64a is formed on the storage plug 60s. The lower interconnection layer includes a circuit interconnection layer 64c connected to the contact plugs 60c. The lower interconnection layer and the plugs may be formed simultaneously using a dual damascene process.

A second interlayer insulating layer 66 is formed on the surface of the substrate 50 including the lower interconnection layer. A lower electrode 70 is formed in the second interlayer insulating layer 66. The lower electrode 70 is connected to the conductive supporting unit 64a on the storage plug 60s. The particular shape of the lower electrode 70 may vary in some embodiments of the present invention. As shown in FIG. 5A, the lower electrode 70 is formed between cylindrical spacers 68.

A data storage element including a phase-changeable material pattern 72p, an upper electrode 74p, and a conductive metal hard mask pattern 76p is formed on the second interlayer insulating layer 66. A third interlayer insulating layer 80 is formed on the surface of the substrate including the data storage element. An upper electrode contact pattern 82a is connected to the conductive hard mask pattern 76p, and conductive contact patterns 82b are connected to the circuit interconnection layer 64c. The upper electrode contact pattern 82a is connected to the metal hard mask pattern 76p through an upper electrode contact hole 80a. The conductive contact patterns 82b extend through the third and second interlayer insulating layers 80 and 66 to electrically connect to the circuit interconnection layer 64c.

An alignment key pattern 82c is formed in the alignment key region Key. The alignment key pattern 82c is formed along a lower surface and inner sidewalls of the alignment key recess 80c. The angle between portions of the alignment key pattern 82c on the sidewalls of the alignment key recess 80c relative to portions on the lower surface may be about 90°. The third interlayer insulating layer 80 is etched and recessed to form the alignment key recess 80c. The conductive metal hard mask pattern 76p is formed to protect the upper electrode 74p during the etching process. Accordingly, the conductive hard mask pattern 76p is used as an etch stop layer while the alignment key recess 80c is formed, such that the alignment key recess 80c can be formed to a sufficient depth without significant damage to the upper electrode 74p. The third interlayer insulating layer 80 as well as the interlayer insulating layers under the third interlayer insulating layer 80 are etched to form the alignment key recess 80c to a relatively deep depth, extending towards the substrate beyond the upper electrode 74p. Thus, the alignment key pattern 82c may have a clearly-defined step difference and may therefore provide a definite and/or readily identifiable alignment key signal in an alignment process used to form an upper interconnection layer 84. The alignment key pattern 82c and the upper electrode contact pattern 82a may be formed of the same material. Although not shown, where the layer used to form the upper interconnection layer 84 is a metal layer, the metal layer may remain on portions of the alignment key pattern 82c.

FIGS. 6A to 6H are cross-sectional views illustrating exemplary intermediate fabrication steps in methods of fabricating phase-changeable memory devices according to some embodiments of the present invention.

Figure 6A:
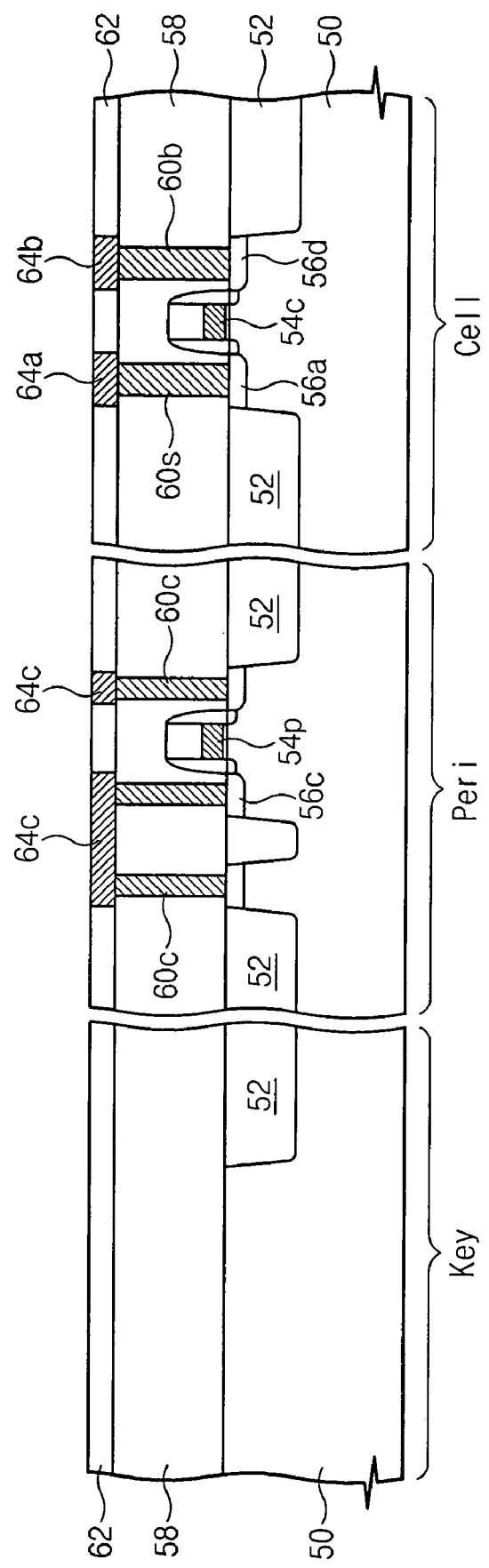
FIGS. 6A to 6H are cross-sectional views illustrating exemplary intermediate fabrication steps in methods of fabricating phase-changeable memory devices according to some embodiments of the present invention.

Referring now to FIG. 6A, a device isolation layer 52 is formed on a substrate 50 which includes an alignment key region Key, a peripheral region Peri, and a cell region Cell defining an active region. A gate electrode 54p and source/drain regions 56c are formed in the peripheral region Peri. A gate electrode 54c, a source region 56a, and a drain region 56d are formed in the cell region Cell. A diffusion layer for well-pickup may also be formed in the peripheral region Peri.

Conductive plugs 60c, a storage plug 60s, and a bit line plug 60b are formed on a surface of the substrate. The conductive plugs 60c cover a first interlayer insulating layer 58 and extend through the first interlayer insulating layer 58 to electrically connect with the source/drain regions 56c. The storage plug 60s is connected to the source region 56a, and the bit line plug 60b is connected to the drain region 56d of the cell region. An insulating layer 62 is formed on the first interlayer insulating layer 58. A lower interconnection layer connected to the plugs is formed in the insulating layer 62. The lower interconnection layer and plugs may be formed simultaneously using a dual damascene process. As such, a circuit interconnection layer 64c is connected to the conductive plugs 60c. A conductive supporting unit 64a is connected to the storage plug 60s. A bit line 64b is connected to the bit line plug 60b. The bit line 64b may be electrically connected to the circuit interconnection layer 64c.

Figure 6B:
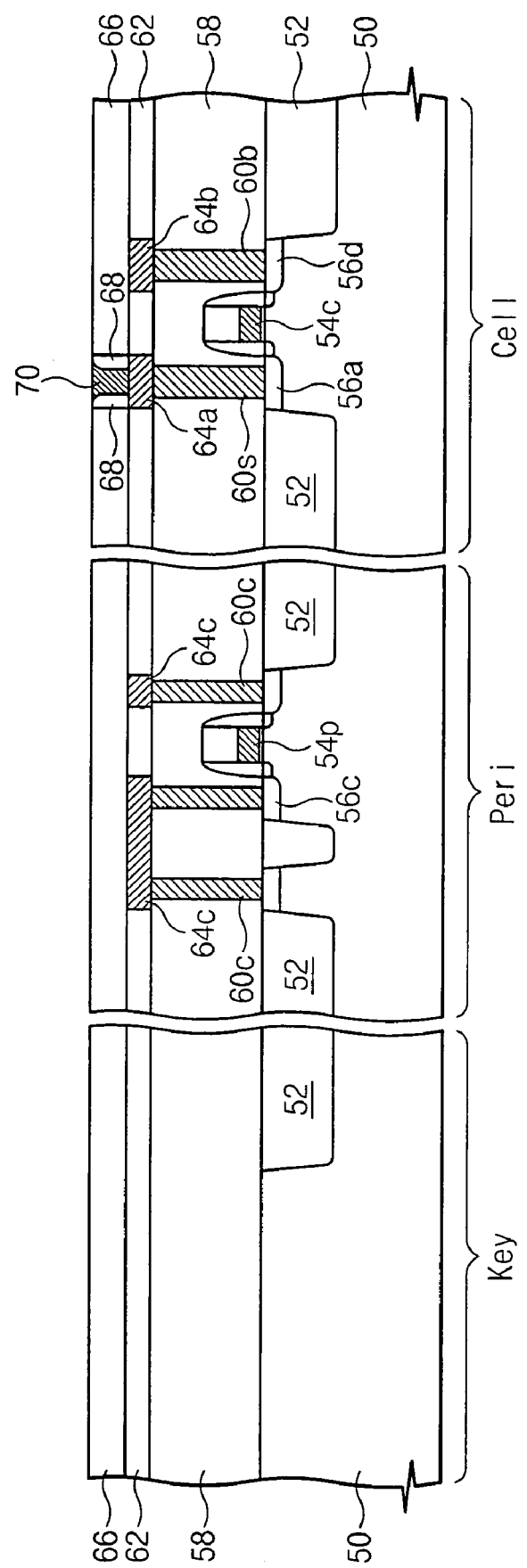

Referring to FIG. 6B, a second interlayer insulating layer 66 is formed on the surface of the substrate on the insulating layer 62 and the lower interconnection layer. A lower electrode 70 electrically connected to the storage plug 60s is formed. The lower electrode 70 may be formed as follows. A contact hole is formed through the second interlayer insulating layer 66 exposing the conductive supporting unit 64a. Cylindrical spacers 68 are formed on inner sidewalls of the contact hole, and a conductive material is formed filling the contact hole between the cylindrical spacers 68.

Figure 6C:
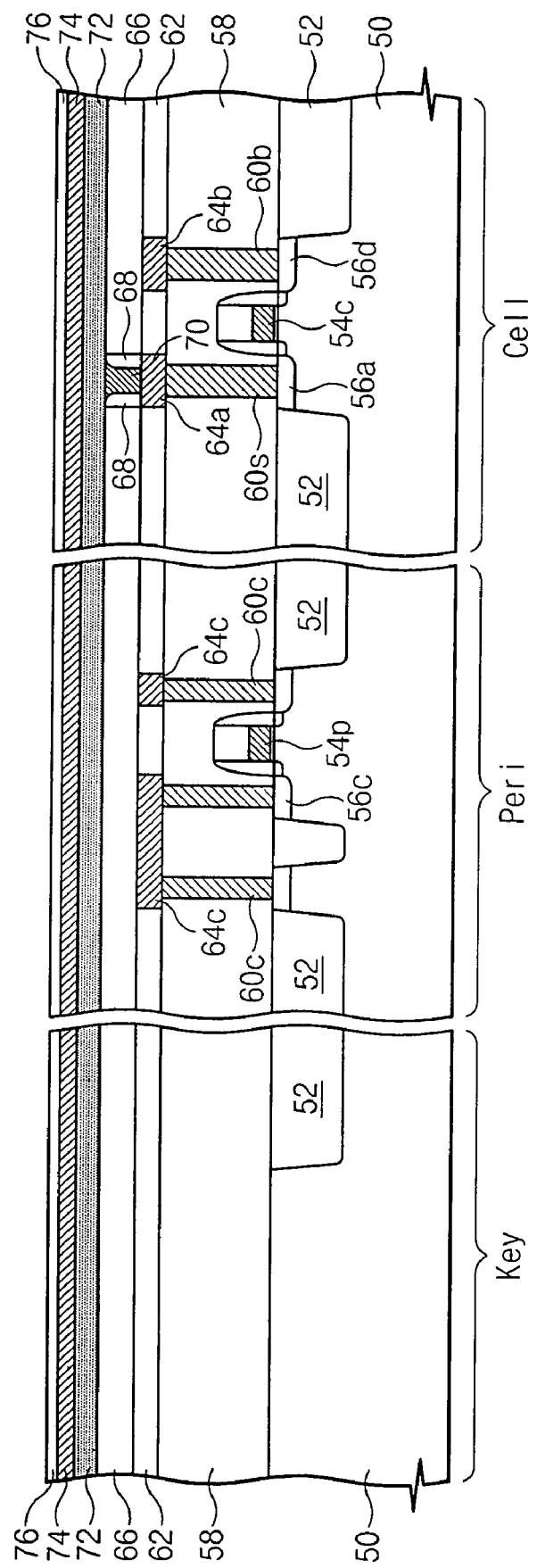

Referring to FIG. 6C, a phase-changeable material layer 72, an upper conductive layer 74, and a metal hard mask layer 76 are sequentially formed on the second interlayer insulating layer 66 and on the lower electrode 70. The phase-changeable material layer 72 may be formed of a GST layer (containing germanium Ge, tellurium Te, and/or stibium Sb). The upper conductive layer 74 may be formed of titanium (Ti) (to promote adhesion), or a titanium-nitride (TiN) stacked layer (to suppress heat). The metal hard mask layer 76 may be formed of an iridium layer, an iridium oxide layer, and/or a stacked layer of iridium and iridium oxide.

Figure 6D:
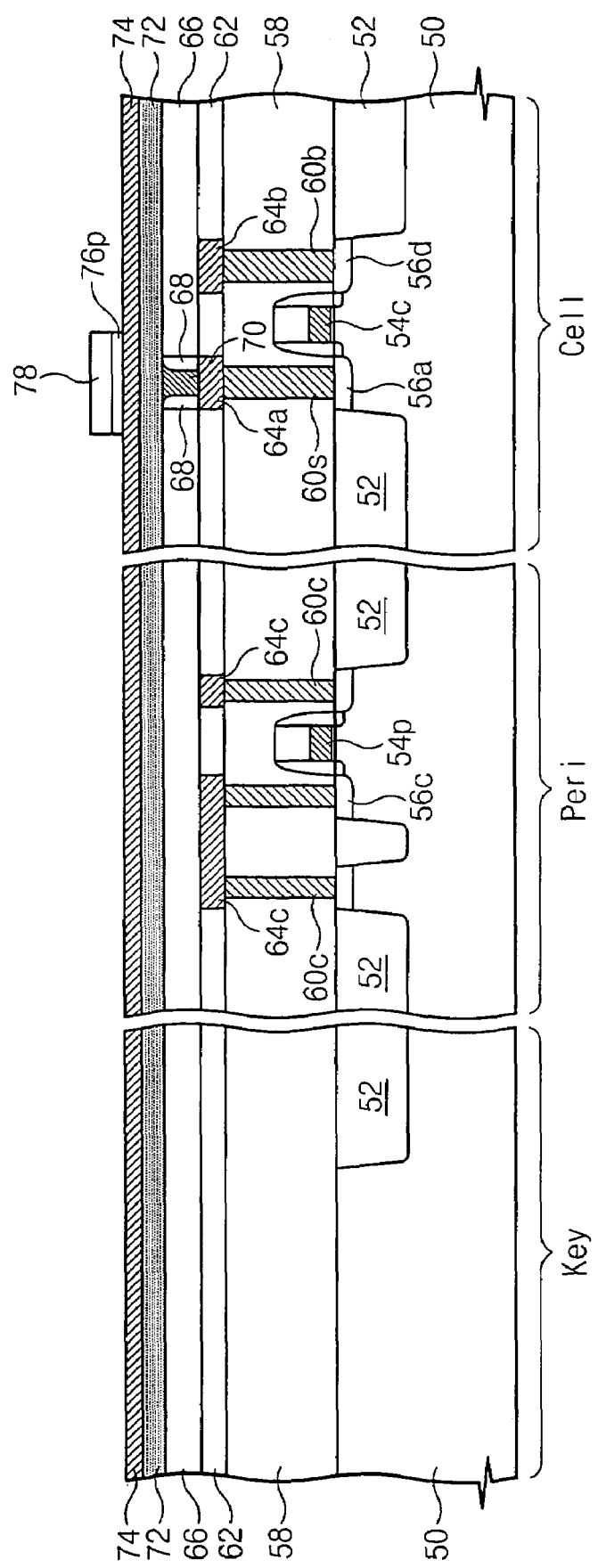

Referring to FIG. 6D, a photoresist pattern 78 is formed on the metal hard mask layer 76. The metal hard mask layer 76 is etched using the photoresist pattern 78 as an etch mask. As a result, a conductive hard mask pattern 76p is formed on the upper conductive layer 74.

Figure 6E:
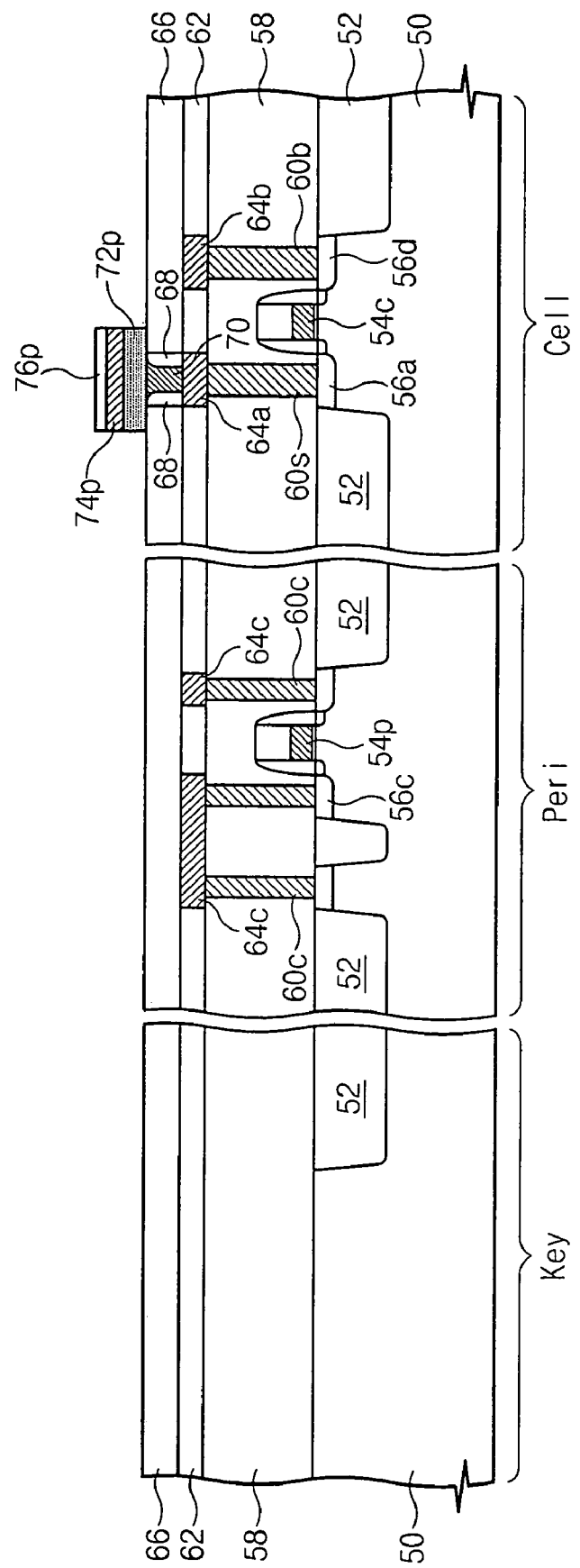

Referring to FIG. 6E, the upper conductive layer 74 and the phase-changeable material layer 72 are etched using the conductive hard mask pattern 76b as an etch mask to form an upper electrode 74p and a phase-changeable material pattern 72p. The conductive hard mask pattern 76b, the upper electrode 74p, and the phase-changeable material pattern 72p may be successively patterned.

Figure 6F:
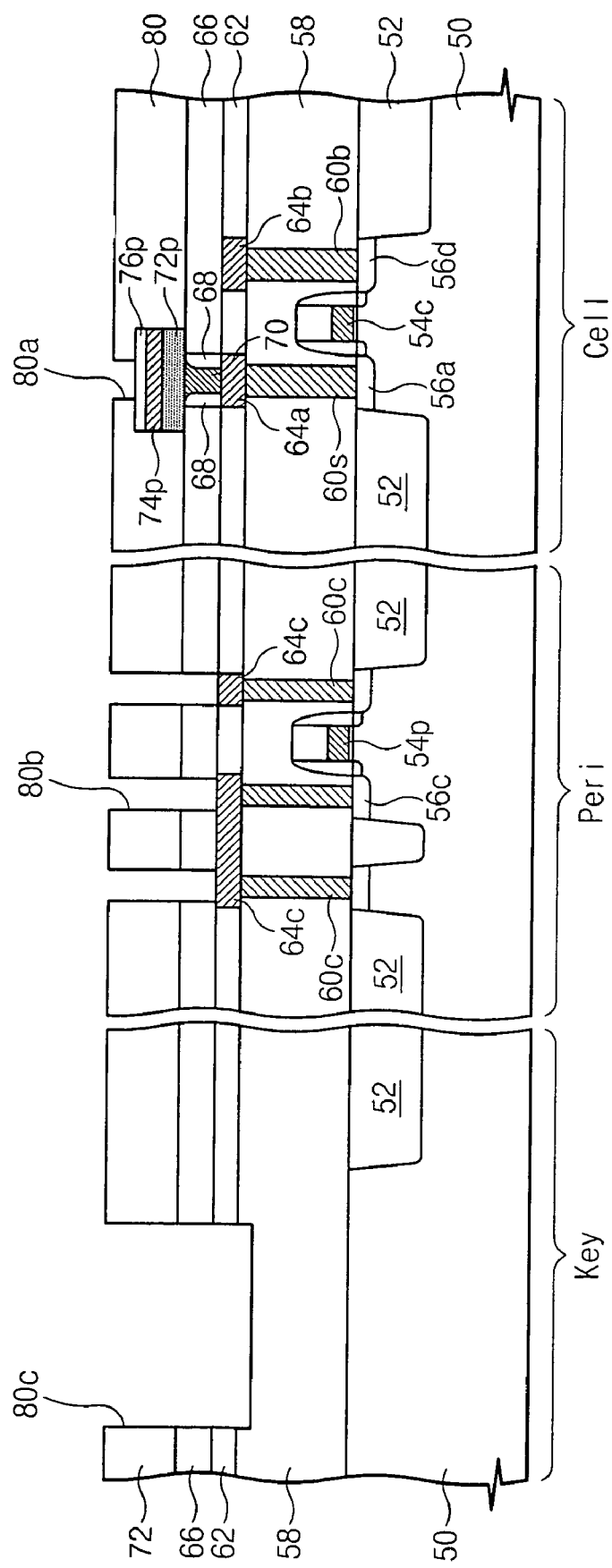

Referring to FIG. 6F, a third interlayer insulating layer 80 is formed on the surface of a substrate including the upper electrode 74p and the phase-changeable material pattern 72p. The third interlayer insulating layer 80 is patterned to form an upper electrode contact hole 80a, contact holes 80b, and an alignment key recess 80c at the same time. At least a portion of the conductive hard mask pattern 76p is exposed by the upper electrode contact hole 80a. Portions of the circuit interconnection layer 64c in the peripheral region Peri is exposed by the contact holes 80b. The contact holes 80b in the peripheral region Peri may be formed to a depth greater than the upper electrode contact hole 80a. More particularly, the conductive hard mask pattern 76p may be used as an etch-stop layer in forming the upper electrode contact hole 80a, such that contact holes 80b may be formed to a greater depth in the peripheral region Peri without damaging the upper electrode 74p. Likewise, the alignment key recess 80c may be formed in the key region Key to a greater depth than the upper electrode contact hole 80a without significant damage to the upper electrode 74p.

Figure 6G:
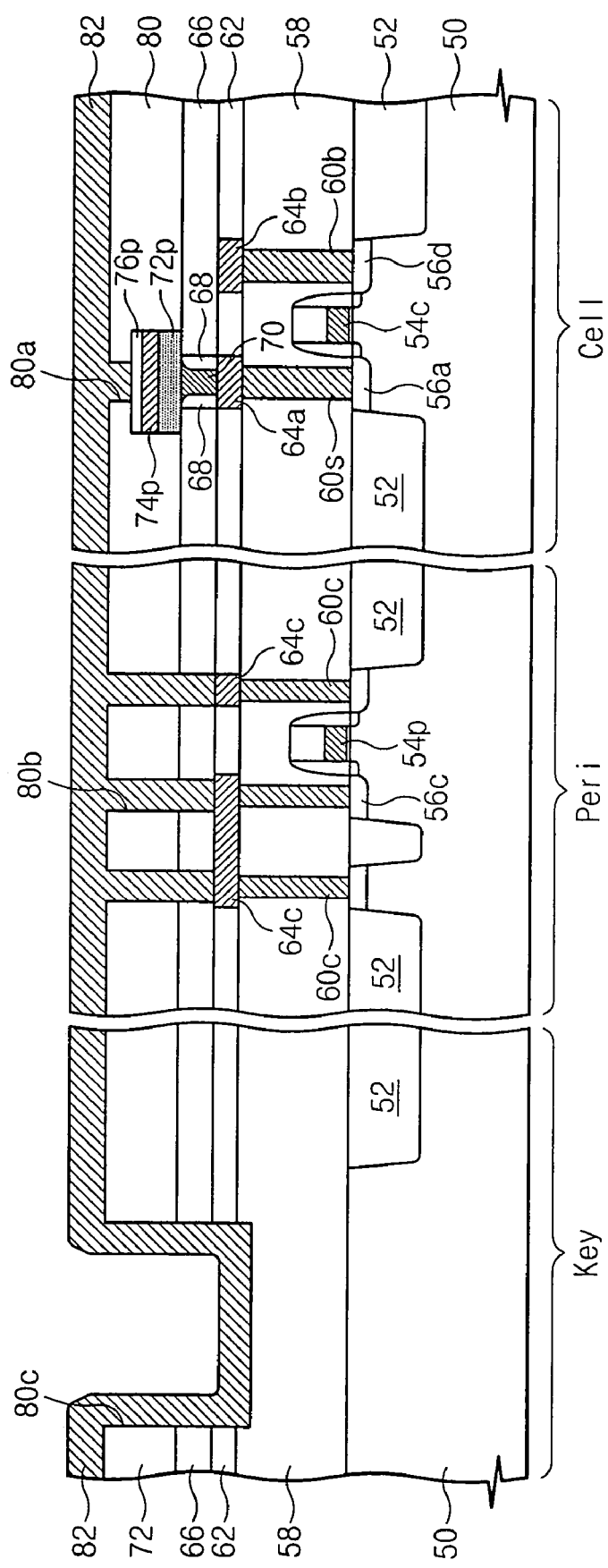

Referring to FIG. 6G, a conductive layer 82 is formed on the surface of the substrate including the upper electrode contact hole 80a, the contact holes 80b, and the alignment key recess 80c. The conductive layer 82 may fill the contact holes 80b and may be formed along inner sidewalls of the alignment key recess 80c. In some embodiments, the conductive layer 82 may be formed of tungsten. Accordingly, due to the increased depth of the alignment key recess 80c, the conductive layer 82 may be formed along the inner sidewalls of the alignment key recess 80c to provide a pronounced and/or definite step difference relative to portions thereof along a lower surface of the alignment key recess 80c.

Figure 6H:
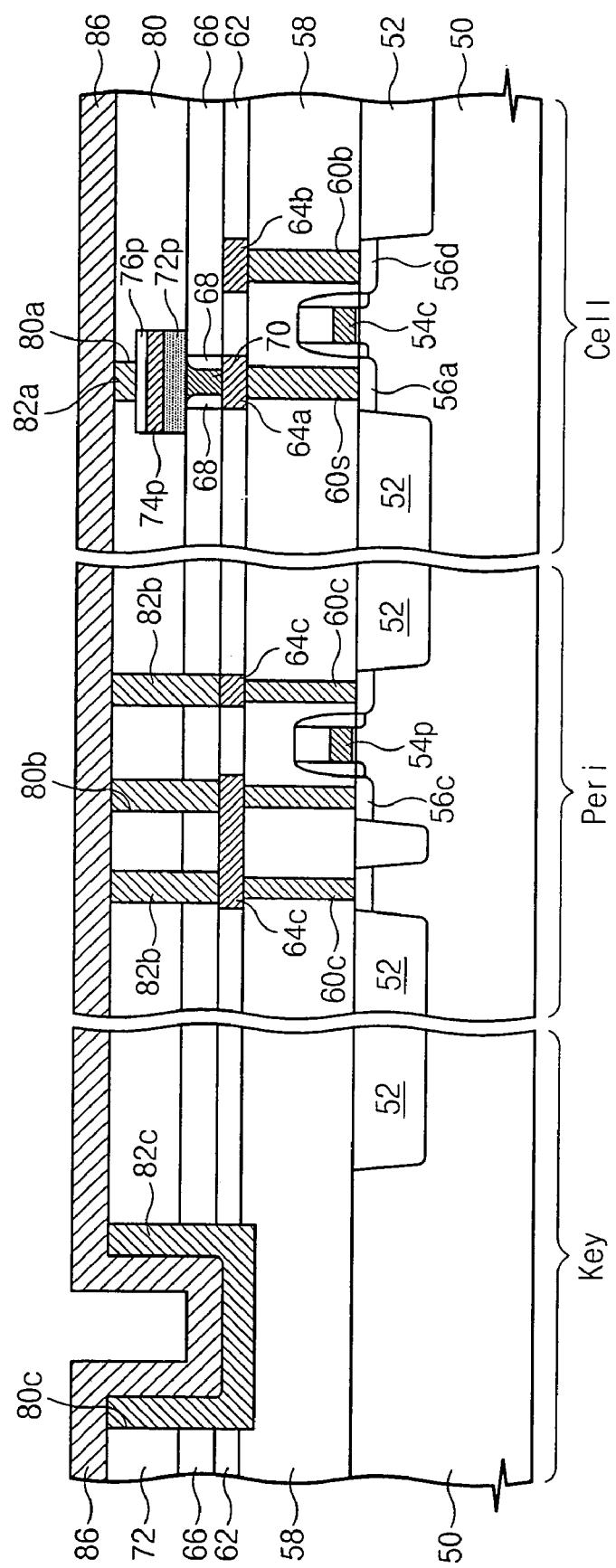

Referring to FIG. 6H, the conductive layer 82 is etched back to form an alignment key pattern 82c, conductive contact patterns 82b, and an upper electrode contact pattern 82a. The alignment key pattern 82c is formed on a bottom surface and on inner sidewalls of the alignment key recess 80c. The conductive contact patterns 82b fill the contact holes 80b of the peripheral region. The upper electrode contact pattern 82a fills the upper electrode contact hole 80a. As shown in FIG. 6H, the alignment key pattern 82c may have a distinct step difference. For example, portions of the alignment key pattern 82c on sidewalls of the alignment key recess 80c may form an angle of about 90° relative to portions thereof on the lower surface of the alignment key recess 80c.

Still referring to FIG. 6H, an upper conductive layer 86 is formed on the surface of the substrate including the alignment key pattern 82c. The upper conductive layer 86 may be patterned to form the upper interconnection layer 84 as shown in FIG. 5A. Accordingly, due to the definite step difference of the alignment key pattern 82c, a strong and/or readily identifiable alignment key signal can be obtained. Also, a more exact alignment between the upper electrode contact pattern 82a and the upper interconnection layer 84 can be provided. When the upper interconnection layer 84 is formed, portions of the upper conductive layer 86 may remain on the alignment key region Key.

Figure 5B:
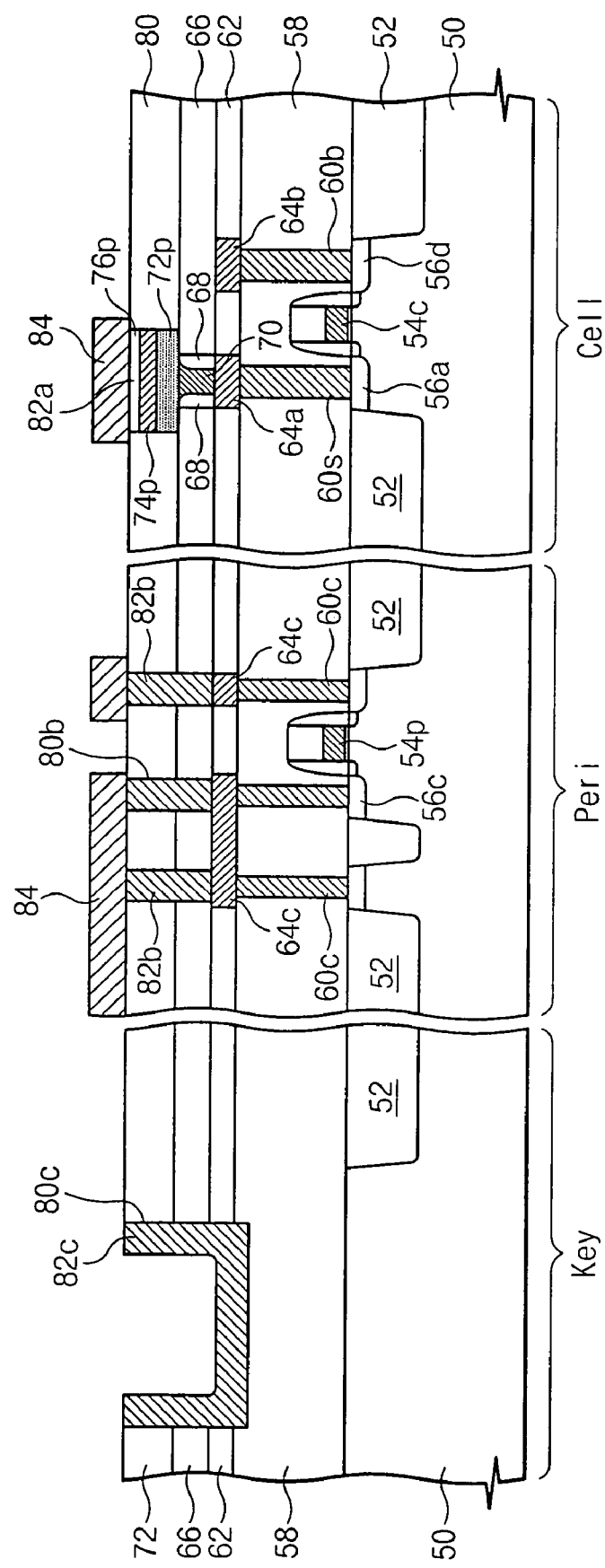

FIG. 5B is a cross-sectional view illustrating phase-changeable memory devices according to further embodiments of the present invention. In FIG. 5B, elements denoted by like reference numerals may correspond to elements of FIG. 5A, and thus, further description thereof may be omitted herein.

In particular, a difference between the embodiments illustrated in FIG. 5B as compared to FIG. 5A is that the upper interconnection layer 84 of FIG. 5B is directly connected to the conductive hard mask pattern 76p, without the upper electrode contact pattern 82a therebetween. The third interlayer insulating layer 80 is formed to a similar level as an upper surface of the conductive hard mask pattern 76p, and an upper metal layer on the third interlayer insulating layer 80 may be directly connected to the conductive hard mask pattern 76p.

FIGS. 7A to 7D are cross-sectional views illustrating exemplary intermediate fabrication steps in methods of fabricating phase-changeable memory devices according to further embodiments of the present invention.

Figure 7A:
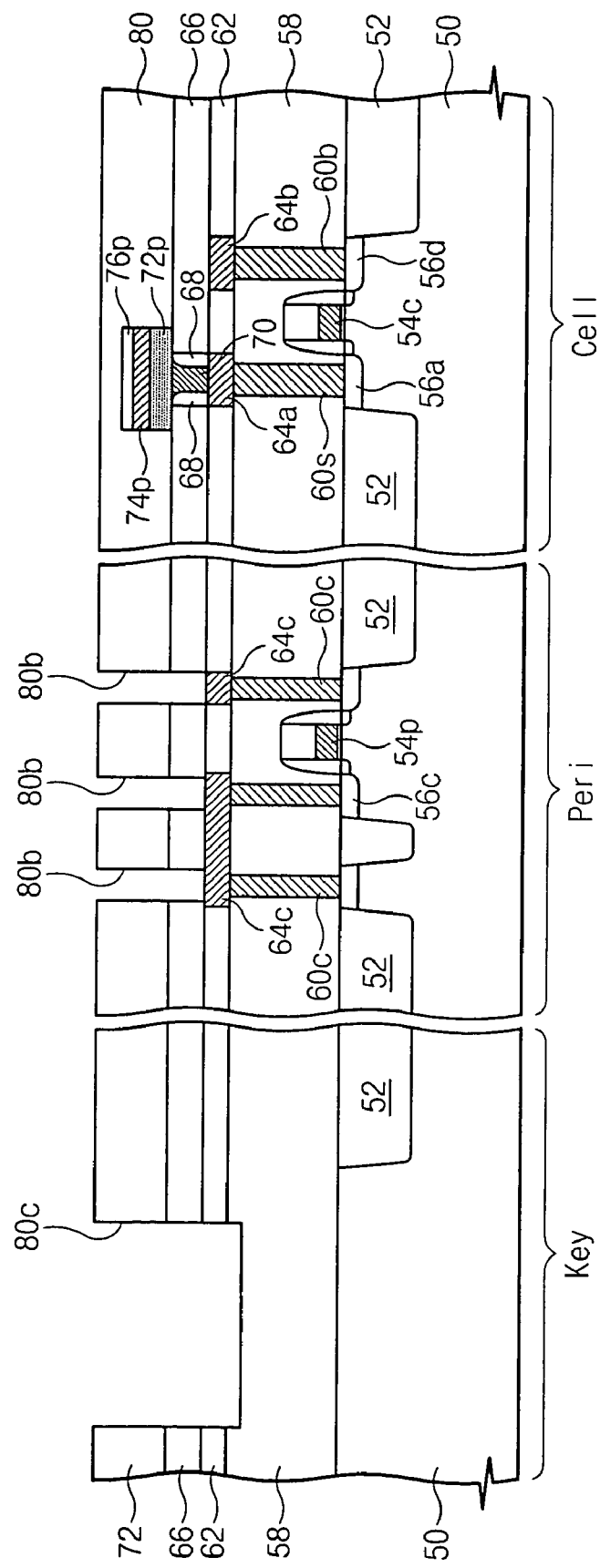

As shown in FIGS. 7A to 7D, the process for forming the third interlayer insulating layer 80 and the preceding layers may be similar to the steps described above with reference to FIGS. 6A to 6F. Accordingly, further embodiments of the present invention are described with reference to the conductive hard mask pattern 76p having a sufficiently high etching selectivity with respect to an interlayer insulating layer. Referring now to FIG. 7A, the third interlayer insulating layer 80 is patterned to form contact holes 80b exposing a circuit interconnection layer 64c of the peripheral region Peri and an alignment key recess 80c in an alignment key region Key. As described above, the alignment key recess 80c may be formed to a depth greater than/beyond that of the upper electrode 74p.

Figure 7B:
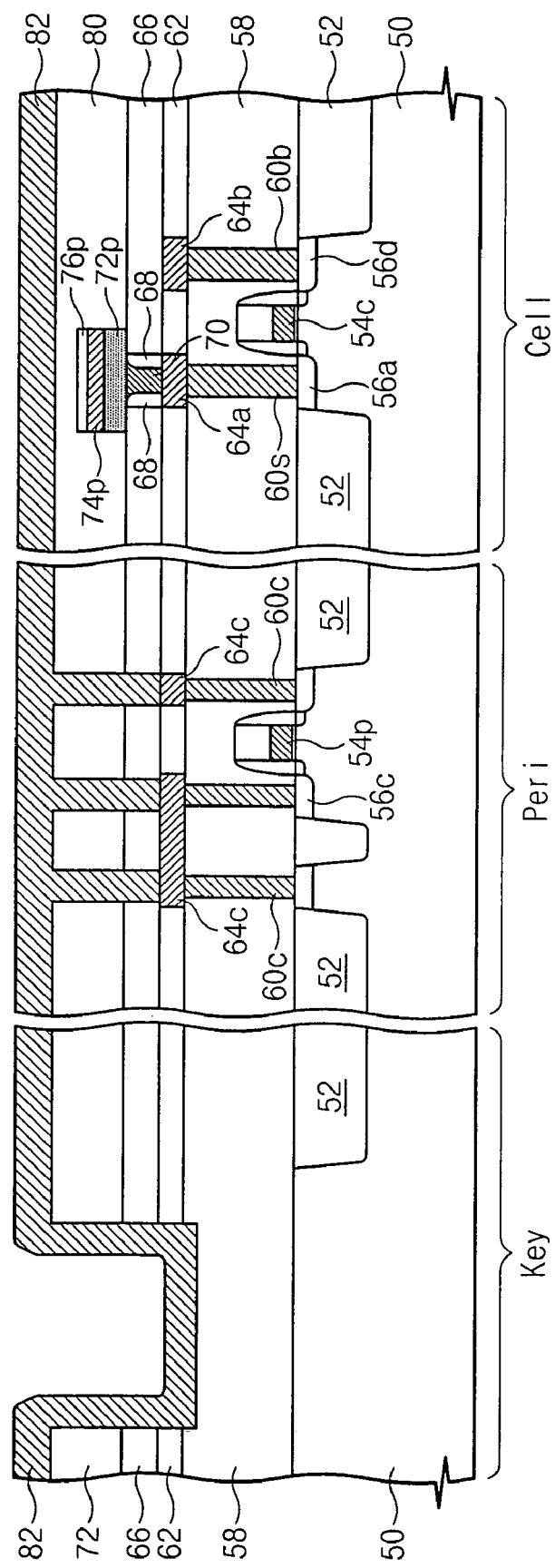

Referring to FIG. 7B, a conductive layer 82 is formed on the surface of the substrate including the alignment key recess 80c.

Referring to FIG. 7C, the conductive layer 82 and the third interlayer insulating layer 80 are sequentially etched back to form an alignment key pattern 82c and conductive contact patterns 82b, and, at the same time, to expose the conductive hard mask pattern 76p. The alignment key pattern 82c is formed along a lower surface and inner sidewalls of the alignment key recess 80c, and the conductive contact patterns 82b fill the contact holes 80b of the peripheral region. When the third interlayer insulating layer 80 is etched back, the conductive hard mask pattern 76p may be used as an etch stop layer.

Figure 7D:
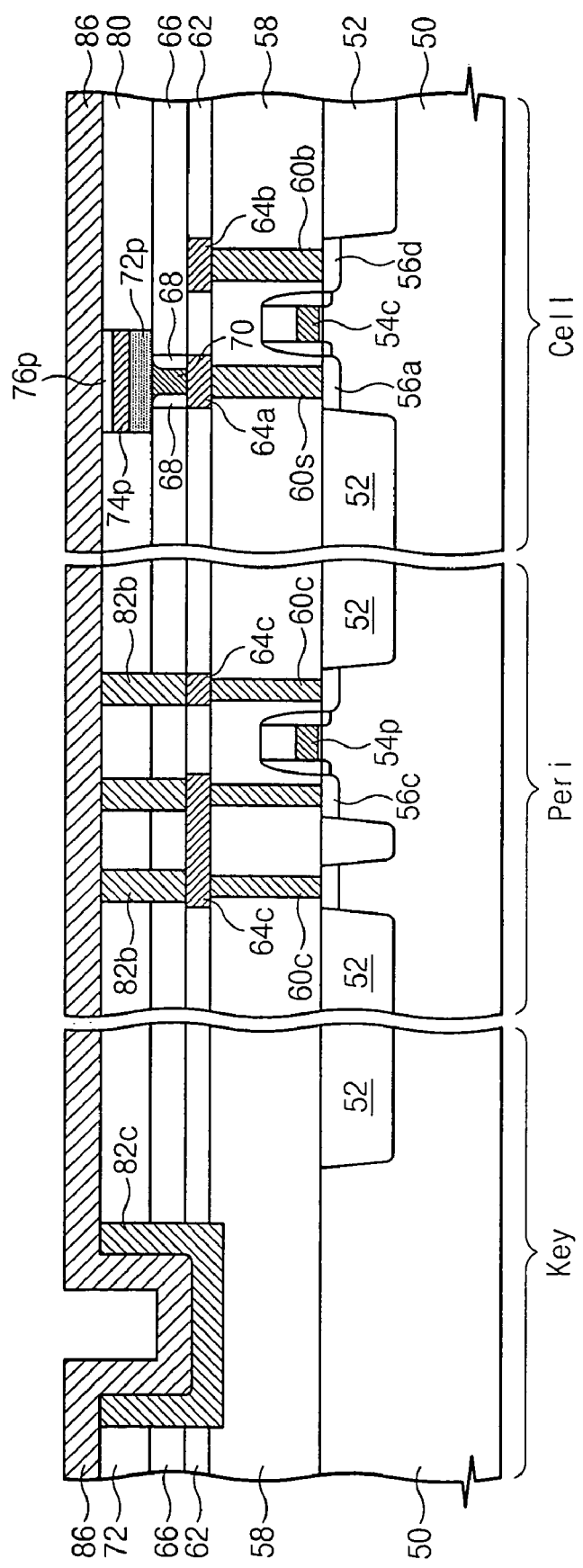

Referring to FIG. 7D, an upper conductive layer 86 is formed on the surface of the substrate. Although not shown, the upper conductive layer 86 may be patterned by forming a photoresist pattern that is aligned based on the alignment key pattern 82c to form the upper interconnection layer 84 of FIG. 5B. Accordingly, as the alignment key pattern 82c may provide strong and/or readily identifiable alignment key signal due to the clearly-defined step difference, the upper interconnection layer 84 can be more exactly aligned with the conductive contact patterns 82b and the conductive hard mask pattern 76p.

Thus, as described herein a conductive metal hard mask pattern is formed on an upper electrode formed of a relatively soft metal. An interlayer insulating layer is patterned using the conductive metal hard mask pattern as an etch stop layer. As a result, a relatively deep alignment key recess may be formed, and as such, an alignment key pattern with a more distinct step difference between portions thereof on the sidewalls of the alignment key recess relative to portions on the lower surface can be formed.

In addition, increased resistance between an upper interconnection layer and a data storage element may be reduced and/or prevented by reducing the likelihood of oxidation of the upper electrode of the data storage element.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

That which is claimed:

1. A method of forming an integrated circuit device, the method comprising:
   forming a conductive hard mask pattern directly on an upper electrode of a storage cell on a substrate, the upper electrode comprising a metal softer than the conductive hard mask pattern; and
   forming an interlayer on the substrate;
   recessing a portion of the interlayer beyond a depth of the upper electrode to form an alignment key recess therein extending towards the substrate beyond the depth of the upper electrode; and
   forming a conductive layer on opposing sidewalls and a surface therebetween of the alignment key recess to define an alignment key pattern extending towards the substrate beyond the depth of the upper electrode and having a distinct step difference between portions thereof on the opposing sidewalls and portions thereof on the surface therebetween.

2. The method of claim 1, wherein an angle between the portions of the alignment key pattern on the opposing sidewalls and the portions on the surface therebetween comprises about 90 degrees.

3. The method of claim 1, further comprising:
   recessing the interlayer in a peripheral region of the substrate to define a peripheral contact hole therein; and
   forming the conductive layer in the contact hole to form a contact pattern in the peripheral region.

4. The method of claim 1, wherein the conductive hard mask pattern comprises a material having a high etch selectivity relative to the interlayer, and wherein recessing a portion of the interlayer comprises:
   selectively etching the portion of the interlayer using the conductive hard mask pattern as an etch stop layer.

5. The method of claim 1, further comprising:
   forming the interlayer on the conductive hard mask pattern;
   forming a cell contact hole in the interlayer exposing at least a portion of the conductive hard mask pattern;
   forming an upper electrode contact pattern in the cell contact hole electrically connected to the conductive hard mask pattern opposite the upper electrode; and
   forming an interconnection layer on the interlayer and electrically connected to the upper electrode contact pattern.

6. The method of claim 5, wherein forming the cell contact hole comprises forming the cell contact hole in a same step as recessing the interlayer to form the alignment key recess, and wherein forming the conductive layer comprises forming the conductive layer in the alignment key recess and in the cell contact hole to define the alignment key pattern and the upper electrode contact pattern in a same step.

7. The method of claim 1, further comprising:
   forming an interconnection layer directly on the conductive hard mask pattern opposite the upper electrode.

8. The method of claim 1, wherein the conductive hard mask pattern comprises a low-resistance metal layer, and wherein the interlayer comprises an insulating layer.

9. The method of claim 1, wherein the upper electrode comprises titanium (Ti) and/or titanium nitride (TiN), and wherein the conductive hard mask pattern comprises iridium (Ir) and/or iridium oxide (IrO).

10. The method of claim 1, wherein the storage cell comprises a phase-changeable memory cell including the upper and lower electrodes and a phase-changeable material layer therebetween.

* * * * *